US012656383B2

(12) United States Patent
Bucklew et al.

(10) Patent No.: US 12,656,383 B2
(45) Date of Patent: Jun. 16, 2026

(54) RYDBERG SENSOR HAVING RYDBERG SENSING REGIONS WITH AT LEAST ONE OPTICAL AMPLIFIER AND ASSOCIATED METHODS

(71) Applicant: Eagle Technology, LLC, Melbourne, FL (US)

(72) Inventors: Victor G. Bucklew, Richmond, VA (US); James A. Drakes, Occoquan, VA (US); Samuel H. Knarr, Melbourne, FL (US); Charles R. Towery, Melbourne, FL (US); George Kannell, Florham Park, NJ (US); Dennis Estrada, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 163 days.

(21) Appl. No.: 18/762,724

(22) Filed: Jul. 3, 2024

(65) Prior Publication Data
US 2026/0009833 A1      Jan. 8, 2026

(51) Int. Cl.
*G01R 29/08*          (2006.01)
(52) U.S. Cl.
CPC ..... *G01R 29/0885* (2013.01); *G01R 29/0892* (2013.01)
(58) Field of Classification Search
None
See application file for complete search history.

(56) References Cited

U.S. PATENT DOCUMENTS

| | | | |
|---|---|---|---|
| 5,546,222 | A | 8/1996 | Plaessmann et al. |
| 10,348,057 | B2 | 7/2019 | Hersman et al. |
| 10,763,966 | B1 | 9/2020 | Deb et al. |
| 10,901,052 | B1 | 1/2021 | Patton et al. |
| 10,979,147 | B2 | 4/2021 | Gordon et al. |
| 11,598,798 | B1 | 3/2023 | Bucklew et al. |
| 11,815,538 | B2 | 11/2023 | Bucklew et al. |
| 12,332,372 | B2 * | 6/2025 | Bucklew .................. G01S 7/28 |
| 2003/0103544 | A1 | 6/2003 | Sakai et al. |
| 2009/0059980 | A1 | 3/2009 | Braun et al. |
| 2009/0289629 | A1 | 11/2009 | Tuchman |

(Continued)

FOREIGN PATENT DOCUMENTS

| | | |
|---|---|---|
| CN | 208488537 | 2/2019 |
| CN | 116298551 | 6/2023 |

(Continued)

OTHER PUBLICATIONS

Cai et al., "Sensitivity Improvement and Determination of Rydberg Atom-Based Microwave Sensor," Photonics; 2022; 9, 250; Apr. 10, 2022; pp. 1-14.

(Continued)

*Primary Examiner* — Jermele M Hollington
(74) *Attorney, Agent, or Firm* — ALLEN, DYER, DOPPELT, + GILCHRIST, P.A.

(57) ABSTRACT
A Rydberg sensor may include a plurality of Rydberg sensing regions and a probe laser source. An optical path may extend from the probe laser source to feed the Rydberg sensing regions in a series configuration. The sensor may also include at least one optical amplifier for the probe laser source coupled within the optical path between at least one adjacent pair of Rydberg sensing regions.

20 Claims, 13 Drawing Sheets

(56)                References Cited

U.S. PATENT DOCUMENTS

| | | | | |
|---|---|---|---|---|
| 2010/0327861 A1 | 12/2010 | Nagasaka | | |
| 2012/0263196 A1 | 10/2012 | Pask et al. | | |
| 2013/0121362 A1 | 5/2013 | Kub et al. | | |
| 2020/0136727 A1* | 4/2020 | Graceffo | ......... | H04B 10/25753 |
| 2023/0059575 A1* | 2/2023 | Bucklew | ........... | G01R 29/0892 |
| 2023/0221406 A1 | 7/2023 | Bucklew et al. | | |
| 2023/0243881 A1 | 8/2023 | Anderson et al. | | |
| 2025/0237686 A1* | 7/2025 | Bucklew | ........... | G01R 29/0878 |
| 2026/0009834 A1* | 1/2026 | Bucklew | ........... | G01R 29/0885 |
| 2026/0009835 A1* | 1/2026 | Lees | ................. | G01R 29/0885 |

FOREIGN PATENT DOCUMENTS

| | | | | | | |
|---|---|---|---|---|---|---|
| DE | 102020212025 | | 3/2022 | | | |
| EP | 3364204 | | 9/2019 | | | |
| EP | 4224188 | | 8/2023 | | | |
| EP | 4679108 | A1 * | 1/2026 | | ......... | G01R 29/0892 |
| KR | 20210044687 | | 4/2021 | | | |
| WO | 2012066527 | | 5/2012 | | | |
| WO | 2024099641 | | 5/2024 | | | |

OTHER PUBLICATIONS

Holloway et al., "Rydberg Atom-Based Field Sensing Enhancement Using a Split-Ring Resonator," Applied Physics Letter; 120, 204001; May 20, 2022; pp. 1-6.

Knarr et al., "Spatiotemporal Multiplexed Rydberg Receiver," IEEE Transactions on Quantum Engineering; Quantum Sensing and Metrology; vol. 4; 3500108; Sep. 29, 2023; pp. 1-8.

Meyer et al., "Assessment of Rydberg Atoms for Wideband Electric Field Sensing," Journal of Physics B: Atomic, Molecular and Optical Physics; vol. 53, No. 3; Jan. 10, 2020; pp. 1-17.

Yao et al., "Sensitivity Enhancement of Far-Detuned RF Field Sensing Based on Rydberg Atoms Dressed by a Near-Resonant RF Field," Optics Letters; vol. 47, No. 20; Oct. 15, 2022; pp. 5256-5259.

U.S. Appl. No. 18/439,791, filed Feb. 13, 2024 Inventors: Bucklew et al.

U.S. Appl. No. 18/415,719, filed Jan. 18, 2024 Inventors: Bucklew et al.

Yuan et al. "Quantum sensing of microwave electric fields based on Rydberg atoms", Cornell University Library, Jul. 2023, pp. 1-28.

* cited by examiner

RYDBERG SENSOR HAVING RYDBERG SENSING REGIONS WITH AT LEAST ONE OPTICAL AMPLIFIER AND ASSOCIATED METHODS

FIELD OF THE INVENTION

The present invention relates to Rydberg sensors, and more particularly, to a Rydberg sensor having Rydberg sensing regions and at least one optical amplifier and related methods.

BACKGROUND OF THE INVENTION

Radio frequency (RF) signals are generated and received in communications and sensing applications across a wide range of commercial markets and government divisions. Emerging RF applications are pushing technical requirements to higher frequency ranges with new waveforms that may be difficult to detect and that may need RF receivers or sensors having increased sensitivity. As conventional RF channels become more heavily crowded, there is a need to use alternative RF bands spanning from tens of KHz to 300 MHz and beyond. While some RF receivers and sensors span multiple RF bands, most are band-limited and can cover only a few tens of GHz, with a typical upper limit of about 40 GHz, e.g., the Ka band. Also, some state-of-the-art RF receivers and sensors are not compatible with new waveforms used in emerging distributed sensing networks and new RF applications that are sensitivity limited, or not served with existing narrow band antenna-based RF receivers and sensors.

Conventional RF devices that incorporate RF antennas may have a high technology readiness level (TRL) and are used in almost every modern RF sensing or communications system. There are limitations with RF antennas, however, because they are Size, Weight and Power (SWaP) limited. The antenna is also on the order of the RF wavelength of radiation, and the RF coverage is over a relatively narrow frequency band, such as 1-10 GHz or 20-40 GHz. Many conventional RF devices employ antenna designs that are not compatible with emerging waveforms and may lack sensitivity, making them difficult to cover wide bandwidths with high sensitivity.

To address these limitations, Rydberg atom-based RF sensors have been developed, which convert the response of an atomic vapor to incoming RF radiation into measurable changes in an optical probe. These RF sensors provide a new model for RF sensing with increased sensitivity. For example, conventional antennas may provide at most about −130 to −160 dB (decibel intensity), but with a Rydberg system, it can be up to about −200 dB with a broader range coverage in a single receiver from KHz to THz.

In a Rydberg atom-based RF sensor, the measurement is based upon the attenuation of a probe laser due to absorption in a small room temperature vapor cell filled with alkali atoms, such as rubidium (Rb) or cesium (Cs). In a 2-photon/laser Rydberg sensing system, atoms are simultaneously excited into a "Rydberg" state with both a coupling laser and probe laser. These Rydberg states are very responsive to local electric fields and the response of the atom to an external electric field, such as an RF signal, alters the measured attenuation of the probe laser, which may be detected by a probe laser photodetector. The magnitude of the electric field component of the incoming RF radiation and its center frequency detuning from atomic resonance may be determined by measuring the magnitude and asymmetry of spectral splitting of the electromagnetically induced transparency (EIT), which is called Autler-Townes (AT) splitting.

Rydberg atom-based RF sensors have emerged as a viable option for surpassing the sensitivity limits of traditional dipole antenna-based receivers, while also reducing the Size, Weight and Power (SWaP), and enabling broad frequency coverage. However, current Rydberg sensors have not realized their theoretical sensitivity limits. The best experimental demonstrations currently provide greater than 35 dB lower sensitivity than theoretical predictions. Accordingly, the best demonstrations are only on par with traditional RF dipole antenna sensitivities.

SUMMARY OF THE INVENTION

In general, a Rydberg sensor may comprise a plurality of Rydberg sensing regions and a probe laser source. An optical path may extend from the probe laser source to feed the plurality of Rydberg sensing regions in a series configuration. At least one optical amplifier for the probe laser source may be coupled within the optical path between at least one adjacent pair of Rydberg sensing regions.

The at least one optical amplifier may comprises a respective optical amplifier coupled between each adjacent pair of a plurality of pairs of Rydberg sensing regions. At least one time delay element may be coupled between the at least one optical amplifier and an input signal of interest (SOI). The at least one time delay element may comprise a Radio Frequency (RF) mirror, for example.

A coupling laser source may be coupled to the optical path. A detector may be downstream from the plurality of Rydberg sensing regions. A controller may be coupled to the probe laser source, the coupling laser source, and the detector. The plurality of Rydberg sensing regions may comprise a plurality of Rydberg gas cells, for example.

Another aspect is directed to a method for receiving a Radio Frequency (RF) signal that may comprise exposing a plurality of Rydberg sensing regions to the RF signal and operating a probe laser source coupled to an optical path extending from the probe laser source to feed the plurality of Rydberg sensing regions in a series configuration. The method may include operating at least one optical amplifier for the probe laser source coupled within the optical path between at least one adjacent pair of Rydberg sensing regions.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout, and prime notation is used to indicate similar elements in different embodiments.

Figure 1:
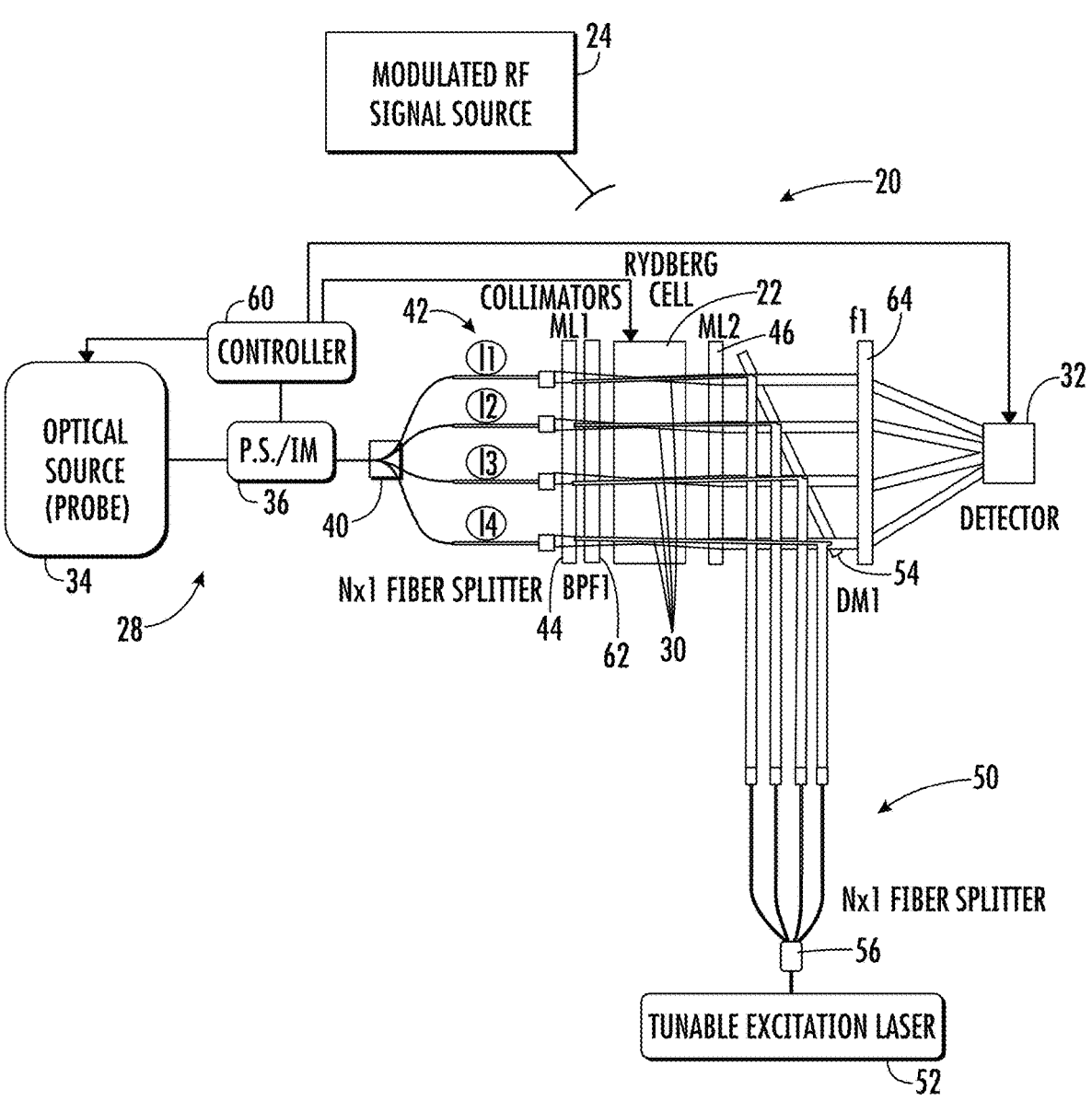
FIG. 1 is a schematic diagram of a known Rydberg sensor.
Figure 2:
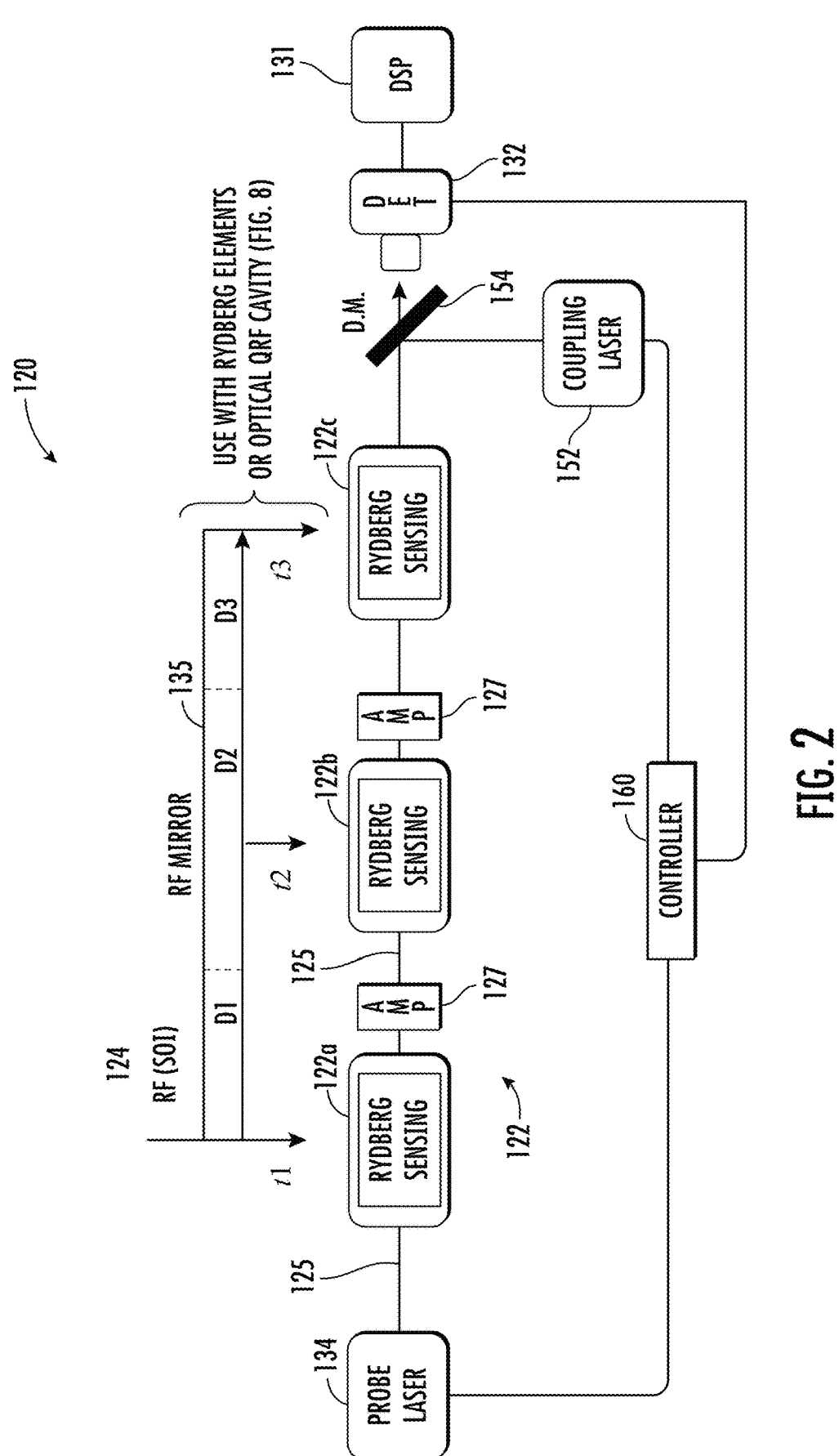
FIG. 2 is a schematic diagram of the Rydberg sensor that includes Rydberg sensing regions in a series configuration and at least one optical amplifier according to the invention.

There now follows a description of a known Rydberg sensor receiver that operates as a Spatiotemporal Multiplexing (STM) Rydberg sensor receiver for high data sampling rate as explained relative to FIG. 1, followed by the approach that increases the number of atoms participating in the measurement, such as by daisy chaining a plurality of Rydberg sensing regions such as single Rydberg elements in a series configuration with at least one optical amplifier for the probe laser source coupled within the optical path between at least one adjacent pair of Rydberg sensing regions as shown in FIG. 2. The Rydberg Sensing Regions in FIG. 1 may each be formed as an optical cavity, i.e., an optical quantum radio frequency (QRF) cavity 145' configuration shown in FIG. 8.

Referring to FIG. 1, a known Spatiotemporal Multiplexing (STM) Rydberg sensor, also referred to as a Rydberg sensor receiver, is illustrated generally at 20 and includes a Rydberg cell 22 that is configured to be exposed to a radio frequency (RF) signal generated from a modulated RF signal source 24. This RF signal source 24 may include a non-modulated RF local oscillator. A laser probe source indicated generally at 28 is configured to generate a plurality of spaced apart pulsed probe beams within the Rydberg cell 22 and generally shown at 30, with the pulsed probe beams being offset in time from one another. It should be understood that one or more Rydberg cells may be used with the probe beams in multiple Rydberg cells. A detector 32 is positioned downstream from the Rydberg cell 22. In the illustrated example, the detector 32 is formed from a photodetector cell. The probe source 28 is configured to generate the plurality of spaced apart pulsed probe beams 30 in an example without scanning and may be formed as an optical source 34 with a pulse shaper 36 that is downstream from the optical source. The Rydberg sensor receiver 20 may work with and without scanning the probe beam. The pulse shaper 36 may be an intensity modulator.

In the illustrated example, the probe source 28 includes a beam splitter 40, such as a Nx1 fiber splitter, downstream from the pulse shaper 36 and a respective optical delay element 42 in a path of each beam downstream from the beam splitter. Each optical delay element 42 may be formed as a respective different length of optical fiber shown by the loops indicated as L1, L2, L3 and L4. A first microlens 44 is positioned adjacent a first side of the Rydberg cell 22 and a second microlens 46 is positioned adjacent a second side of the Rydberg cell as illustrated by the designations ML1 and ML2.

An excitation source 50 as a coupling laser is coupled to the Rydberg cell 22 and formed as a tunable excitation laser 52 and at least one mirror 54, such as a dichroic mirror downstream therefrom to input the output of the excitation laser and excite the rubidium or cesium used within the Rydberg cell 22. For a 4-beam version, as shown in FIG. 1, the Nx1 fiber splitter 56 is a 4x1 splitter and may split the output into four beams from the excitation laser 50 corresponding to the illustrated four probe beams 30. A controller 60 is coupled to the Rydberg cell 22, the optical source 34 as the laser probe of the probe source 28, and detector 32. The delay mechanism may not only delay tunability as noted above, but also direct modulation temporal gating of one or more excitation lasers 52.

As illustrated, a bandpass filter (BPF1) 62 may be included to block the excitation laser 52 and pass the spaced apart probe beams 30. This component may be a wavelength division multiplexer or a dichroic mirror. A plano convex lens (f1) 64 may focus the probe beams 30 to the detector 32. The first microlens 44 and bandpass filter 62 may be formed as a collimator device, e.g., a Thorlabs Part No. 50-780, and have a collimator output with about a 0.5 mm spot size beam at 780 nanometers as generated from the optical source 34 as a laser.

The Rydberg cell 22 is a rubidium Rydberg cell, such as Thorlabs part no. GC19075-RB. Other vapors of specific atomic elements may include Cesium (Cs), Potassium (K), Sodium (Na), and possibly Iodine (I). The Rydberg sensor receiver 20 as illustrated will temporally and spectrally shape the signature of the pulsed probe beams 30, and thus, allows an increase in the sampling rate as proportional to the number of beams "N." Increasing the sampling rate is also dependent on the probe repetition rate. Separating the probe source 28 as a probe laser beam into N distinct pulses, each of which interrogates a distinct volume of the Rydberg cell 22, will increase the sampling of an incoming RF field in proportion to the number of beams "N." In addition to increasing the sampling rate, the bandwidth of the probe pulses may also help reduce the latency usually incurred by scanning the probe beam across the EIT spectrum. This may reduce the latency from about 1 to 2 orders of magnitude. The temporal pulse width of the probe determines its spectral bandwidth through a Fourier transform.

It is possible to increase the probe bandwidth generated from the optical source 34 from about 100 KHz to about 200 MHz by choosing an appropriate pulse width. The incoming RF field may be mapped onto a spectroscopic fingerprint without scanning. The Rydberg sensor receiver 20 captures a response directly correlated to the integrated line absorption spectrum, i.e., the equivalent width for the case of the spectral character of the source propagating through the atomic vapor at/near the frequency of an atomic absorption line modified by the pressure of EIT. Further details of the Rydberg sensor 20 described with respect to FIG. 1 are explained in U.S. Pat. No. 11,598,798 to Bucklew et al., assigned to Eagle Technology, LLC, the disclosure which is hereby incorporated by reference in its entirety.

As will be explained with reference to the embodiments shown in FIGS. 2-12, it is possible to increase the Rydberg sensor's sensitivity by increasing the number of atoms participating in the measurement and increase its optical visibility in discerning changes in RF power by increasing the length of the absorbing medium. Increasing the number of atoms by increasing the concentration of the atoms in a shorter Rydberg cell may cause clamping due to adverse effects of atom-atom interactions, such as blockades and Doppler effects. Increasing the Rydberg cell length alone may cause the probe laser beam to be absorbed, which may degrade the effective interaction length that may be achievable. These technical drawbacks are addressed and overcome by the Rydberg sensor 120, 120' explained with reference to FIGS. 2-12 by daisy chaining a plurality of Rydberg sensing regions as separate Rydberg elements in a series configuration with at least one optical amplifier, or using an optical cavity as an optical quantum radio frequency (QRF) cavity 145' (FIG. 8) that is not an RF cavity, but an optical cavity that incorporates a Rydberg element, such as a Rydberg cell. The cavity of FIG. 8 may be referred to as an optical QRF cavity or QRF cavity.

Figure 6A:
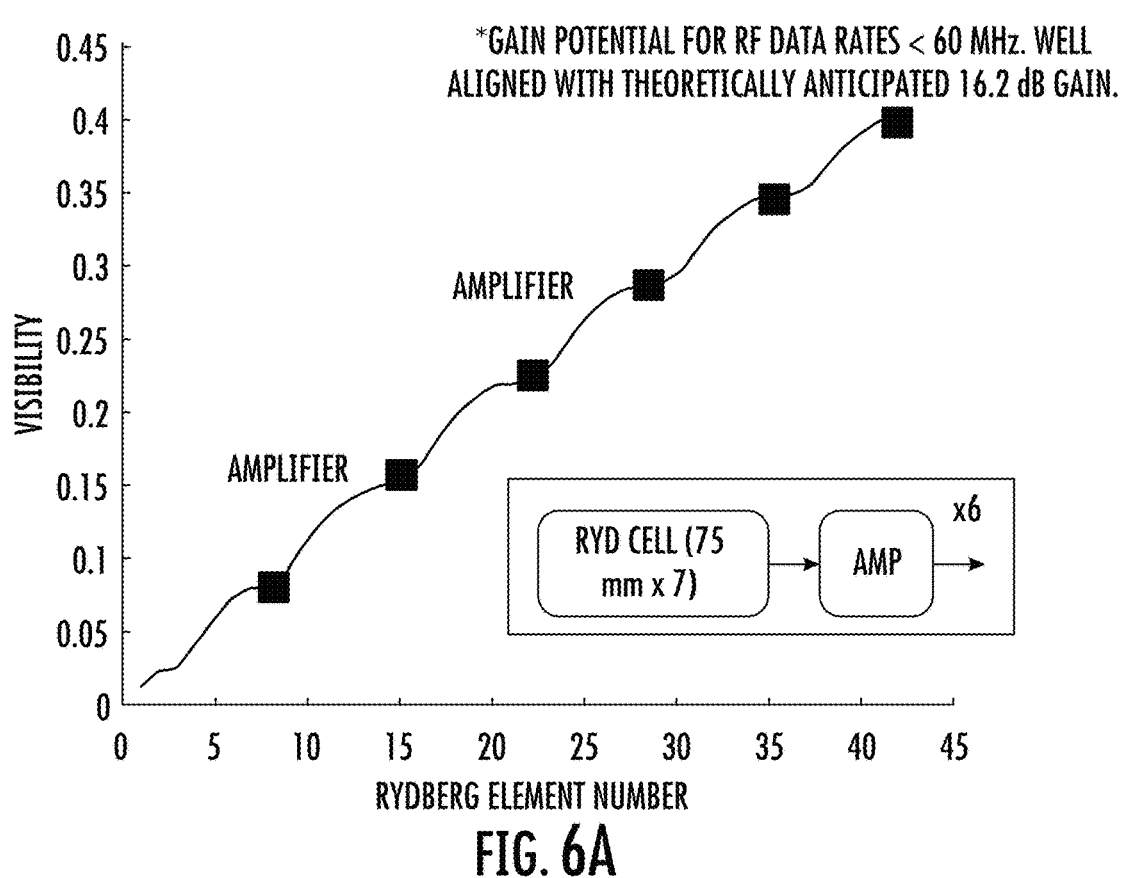
FIG. 6A is a graph showing a Rydberg sensor model according to the invention and the increase in visibility with six series connected Rydberg cells with amplification.
Figure 6B:
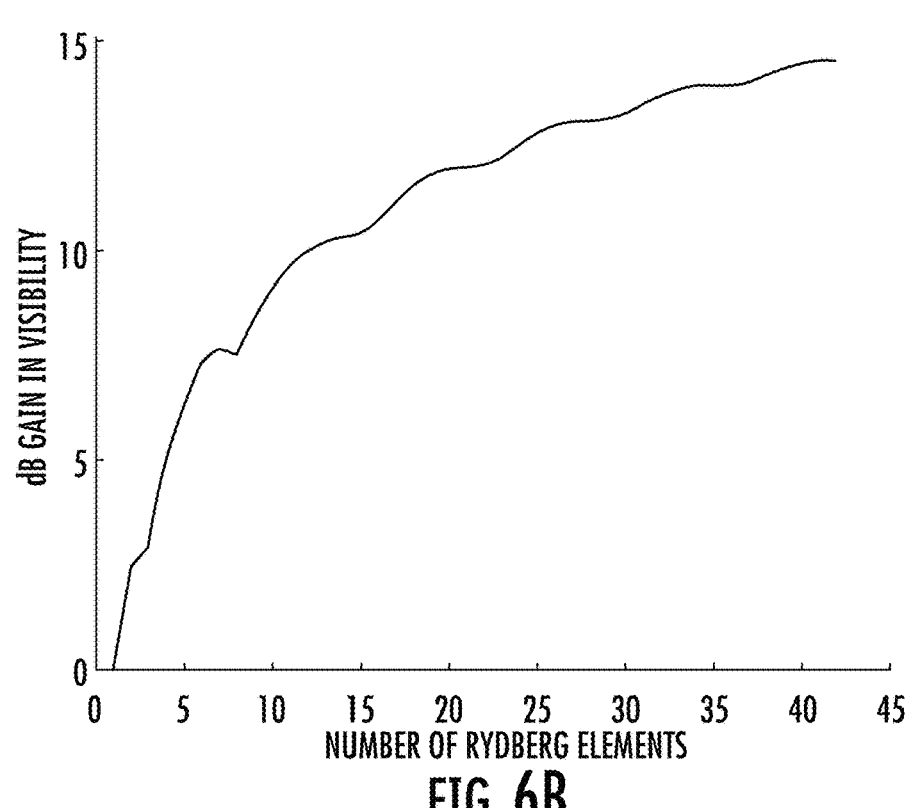
FIG. 6B is a graph of the Rydberg sensor model showing a 15 decibel gain in visibility for the six series connected Rydberg cells with amplification as in FIG. 6A.
Figure 7:
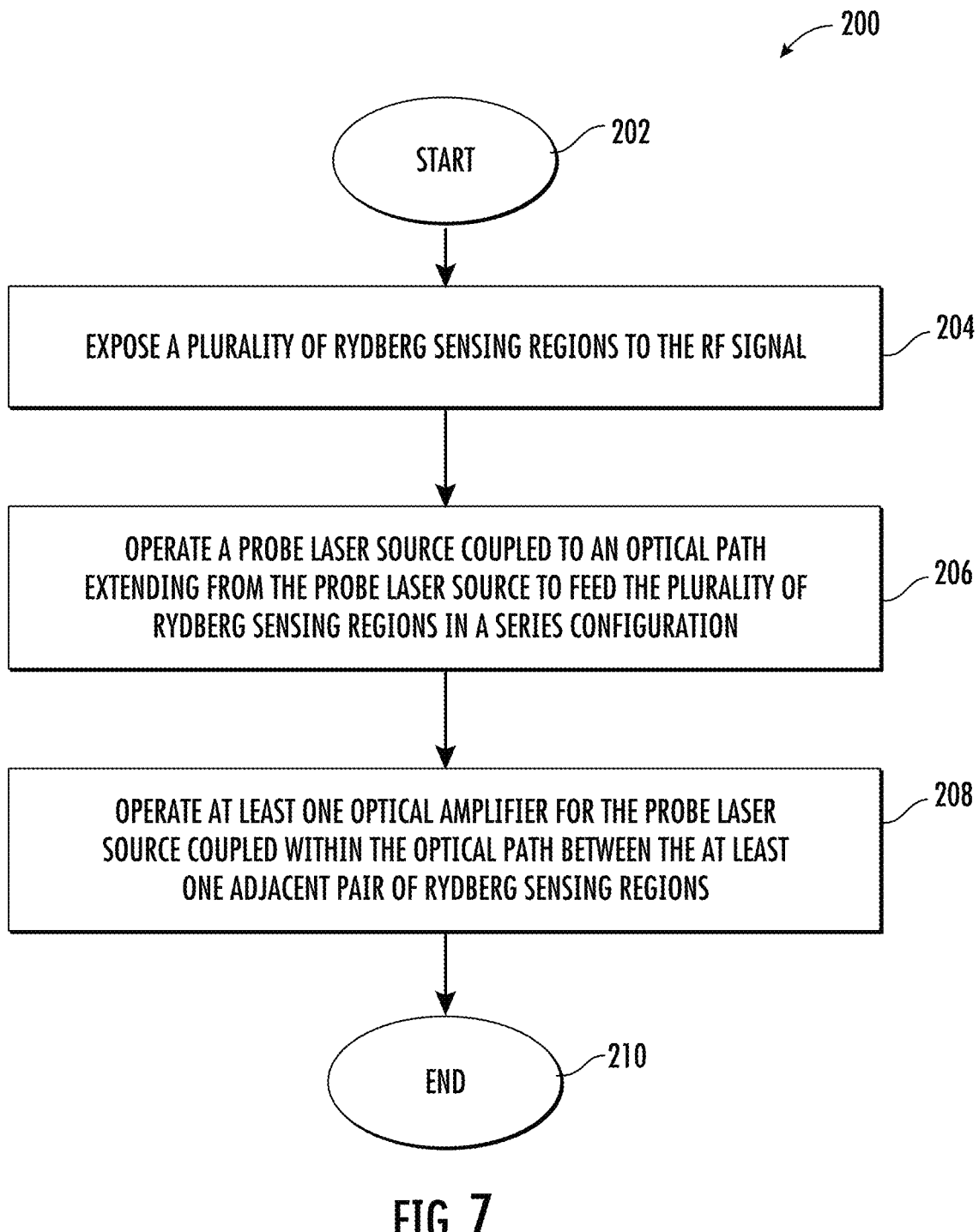
FIG. 7 is a flowchart showing a method for receiving a RF signal using the Rydberg sensor of FIG. 2 according to the invention.
Figure 8:
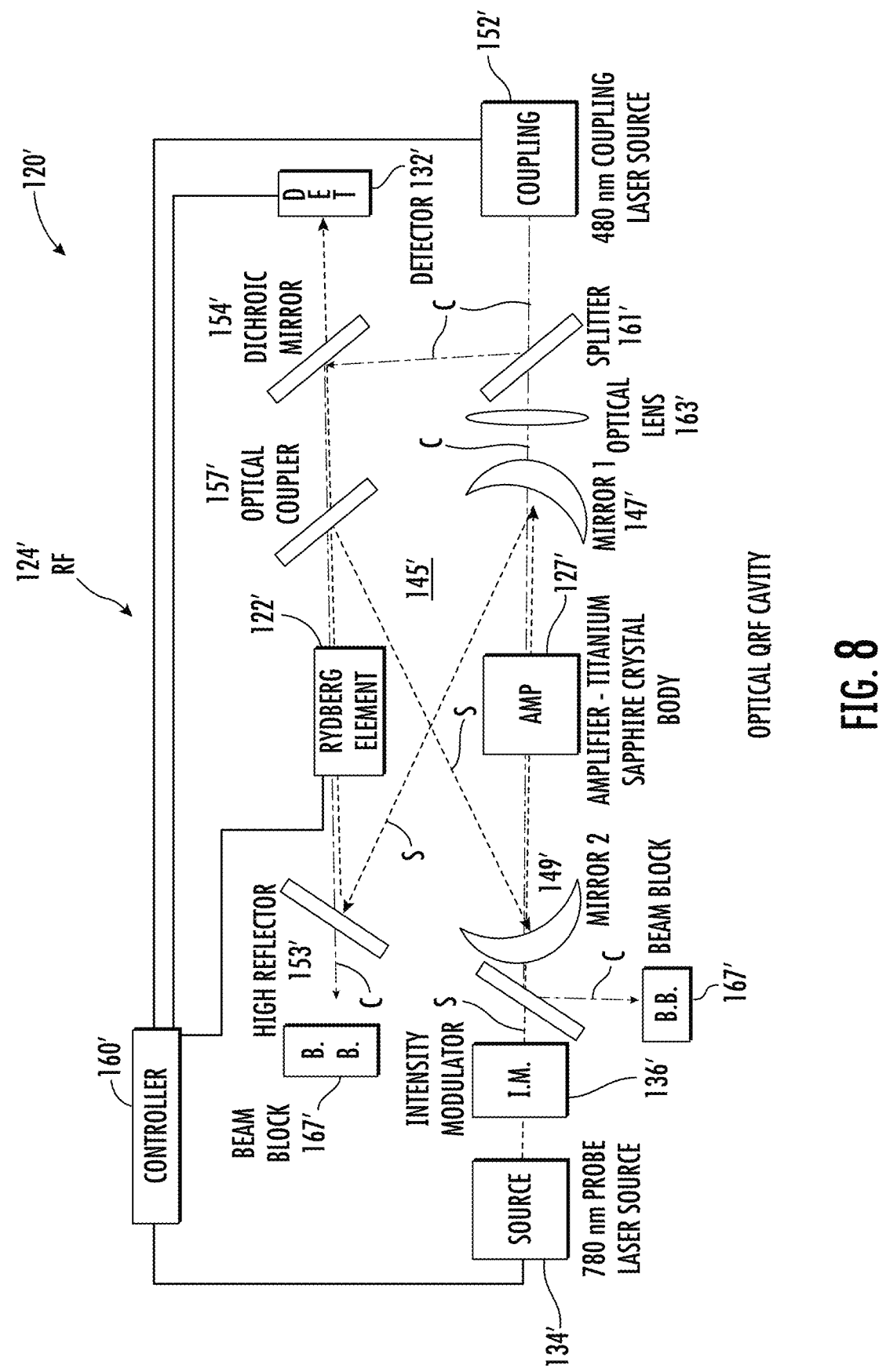
FIG. 8 is a schematic diagram of a second embodiment of the Rydberg sensor employing a quantum radio frequency (QRF) cavity according to the invention.

Similar components and elements for the Rydberg sensor 120, 120' embodiments, according to the invention described relative to FIGS. 2-12, are given common reference numerals in the 100 series. The second embodiment of FIG. 8 shows in detail the configuration of the optical cavity that incorporates a Rydberg element, such as a Rydberg cell and that optical cavity may be termed QRF cavity or optical QRF cavity 145', and the reference numerals are given in prime notation.

As shown in FIG. 2, the Rydberg sensor 120 includes a plurality of Rydberg sensing regions 122 with each individual Rydberg sensing region numbered 122a, 122b, 122c and a probe laser source 134. Although three Rydberg sensing regions 122a, 122b, 122c are shown, a greater number may be employed depending on design and end use applications. The plurality of Rydberg sensing regions 122 in an example may be formed as a plurality of Rydberg elements as gas cells, such as described above, or in the configuration of the cavity 145' shown in FIG. 8, which incorporates a Rydberg element and other optical elements as explained below. This Rydberg sensing region 122 may be a Rydberg cell or element and formed as a gas in a hollow core fiber or a bulk element. The optical cavity, i.e., optical QRF cavity 145', may be a solid state face space cavity or could be an optical fiber cavity. An optical path 125 extends from the probe laser source 134 to feed the plurality of the Rydberg sensing regions 122 in a series configuration similar to a daisy chain. The optical path 125 may be formed as an optical fiber or other optical medium, such as a gas or vacuum or free space as non-limiting examples.

At least one optical amplifier 127 for the probe laser source 134 is coupled within the optical path 125 between at least one adjacent pair of Rydberg sensing regions 122a, 122b, 122c. In an example, a plurality of optical amplifiers 127 are included, with each optical amplifier positioned between adjacent pairs of the Rydberg sensing regions 122. The optical amplifiers 127 cooperate with the plurality of Rydberg sensing regions 122a, 122b, 122c, effectively increasing the cell length, while maintaining the concentration of atoms in the Rydberg sensing regions. The absorption of the laser beam generated from the probe laser source 134 is mitigated or counterbalanced in this configuration, and thus, a higher sensitivity and visibility is obtained.

In an example, a coupling laser source 152 is coupled to the optical path 125 via a dichroic mirror 154. Although one coupling laser source 152 and one probe laser source 134 are illustrated, two or more coupling laser sources and two or more probe laser sources may be used. A detector 132, such as a photodetector, is downstream from the plurality of Rydberg sensing regions 122a, 122b, 122c. A controller 160 is coupled to the probe laser source 134, the coupling laser source 152, and the detector 132 to control operation of the lasers and detector. Signals received at the detector 132 may be further analyzed at the controller 160, and in this example, at a digital signal processor (DSP) 131 connected to the detector.

At least one time delay element 135 is coupled between the at least one optical amplifier 127 and an input signal of interest (SOI) 124, which in this example may be a RF signal, such as by deploying use of a time delay element formed as a radio frequency (RF) mirror. In an example, one RF mirror 135 as the time delay element may be used to split and/or reflect the RF signal 124 with the appropriate delay into the series configured Rydberg sensing regions 122a, 122b, 122c. The time delay element 135 may preferably be used with the optical cavity, i.e., optical QRF cavity 145' configuration explained relative to FIG. 8 when cavities are placed in series. This delay may be accomplished by a plurality of time delay elements 135, such as a respective delay path in an RF mirror with the time delay elements shown by the dashed configuration splitting into three delay elements in FIG. 2 labeled D1, D2 and D3. The incoming RF signal 124 is split and delayed so that the RF signal being measured arrives at a subsequent Rydberg sensing region 122a, 122b, 122c at the same time as the probe laser 134 to increase the interaction region beyond that possible with a single Rydberg sensing region 122, such as an optical cavity, i.e., QRF cavity 145'.

It is possible to match the delay from the probe laser 134 and the RF waveform 124 being measured to increase the sensitivity beyond the limits of a single Rydberg sensing region 122, which would be clamped by the data modulation rate of the RF signal being measured. The use of the series configured Rydberg sensing regions 122 in a daisy chain configuration enhances the Rydberg sensor 120 sensitivity and increases data rates. In a non-limiting example, at 1 MHz and with three Rydberg sensing regions 122a, 122b, 122c, each having a 36 dB enhancement and employing reflection and delay from the RF signal 124, it is possible to achieve 108 dB enhancement in the Rydberg sensor 120. With the use of the optical cavity, i.e., optical QRF cavities 145' in the series configuration, additional losses from the RF mirrors and splitting may reduce this enhancement, but there is monotonous increase with the number of Rydberg sensing regions 122' due to multiple cavities in series.

Figure 3:
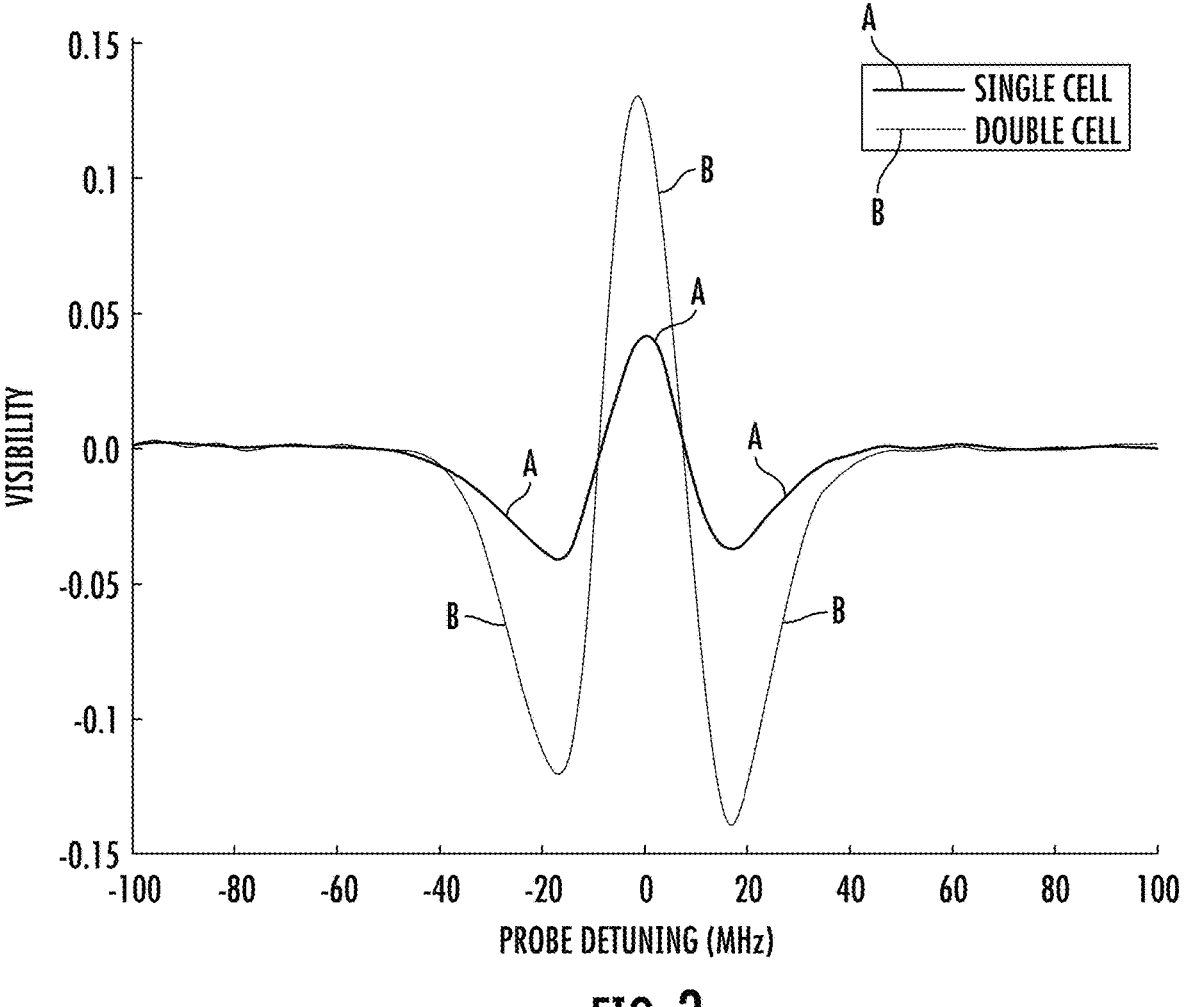
FIG. 3 is a graph of a Rydberg sensor model comparing visibility obtained with one versus two Rydberg sensing regions.

Referring now to FIG. 3, there is illustrated a graph showing the experimental results for a Rydberg sensor model having two Rydberg sensing regions 122 in series and visibility at zero (0) detuning and showing the comparison between a single Rydberg sensing region 122 as a single Rydberg cell with two Rydberg sensing regions that are series configured double Rydberg cells. The single cell is shown by the line marked "A" and the double cell is shown by the line marked "B." The graph shows an enhancement greater than three with the double Rydberg cells 122, and in this computer model, an enhancement of 3.14.

Figures 4A, 4B:
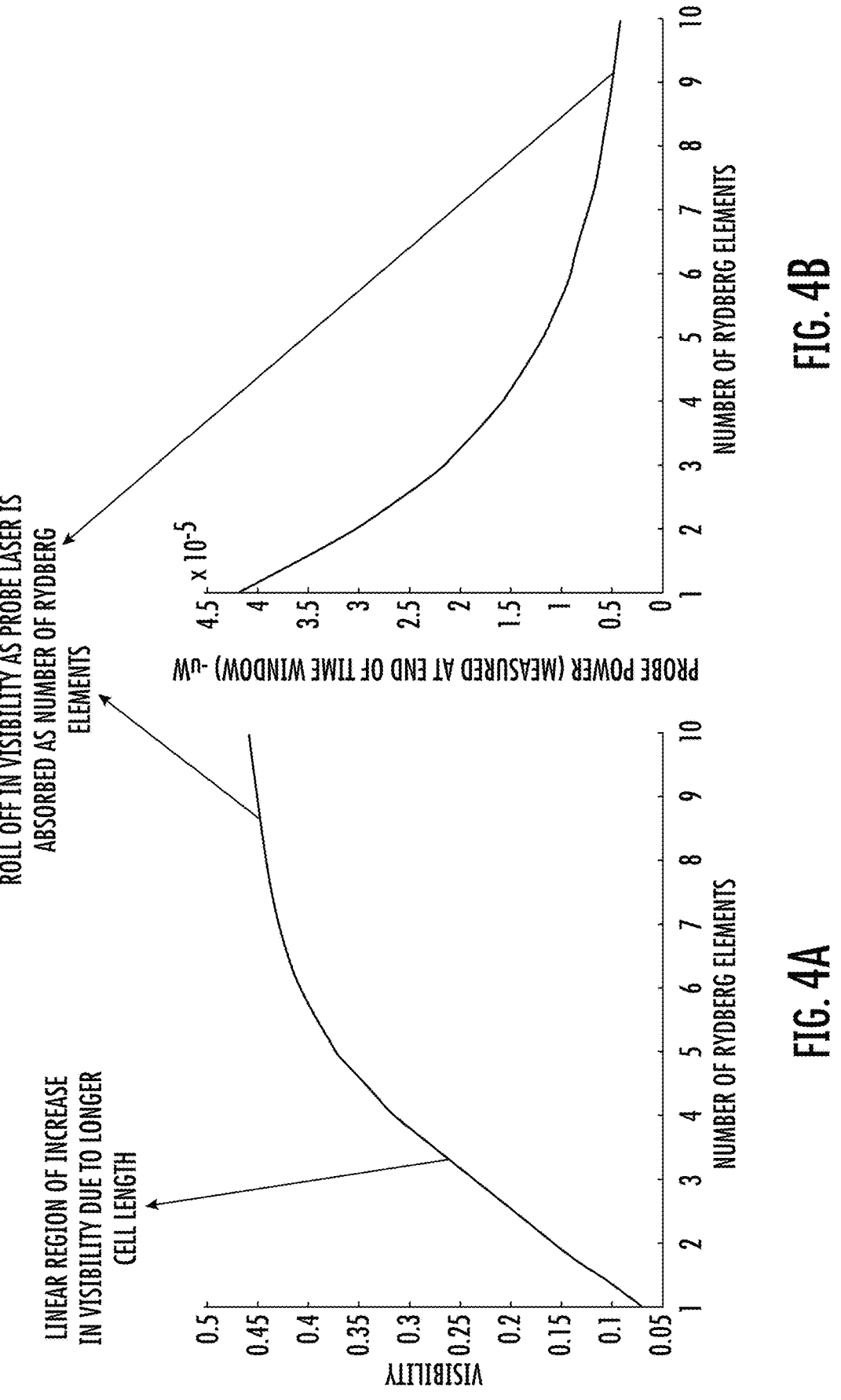
FIG. 4A is a graph of a Rydberg sensor model showing the roll off in visibility as the Rydberg cell length increases without amplification.
FIG. 4B is a graph showing a Rydberg sensor model and the reduction in probe power as the Rydberg cell length increases without amplification.

The graphs in FIGS. 4A and 4B show numerical results in an experimental Rydberg sensor 120 model without employing optical amplifiers, where the number of Rydberg elements increase along the horizontal axis as shown in each graph. The graph in FIG. 4A shows the increase in visibility. The linear region of increase is due to the longer cell length with the increase in the number of Rydberg sensing regions 122 as Rydberg elements. The increase in visibility is shown in vertical axis of the graph in FIG. 4A relative to the number of Rydberg elements. The probe laser power that is measured at the end of the time window is shown in the vertical axis of the graph in FIG. 4B. Both graphs of FIGS. 4A and 4B show the roll off in visibility as the probe laser 134 is absorbed and the number of Rydberg sensing elements 122 increase.

Figures 5A, 5B:
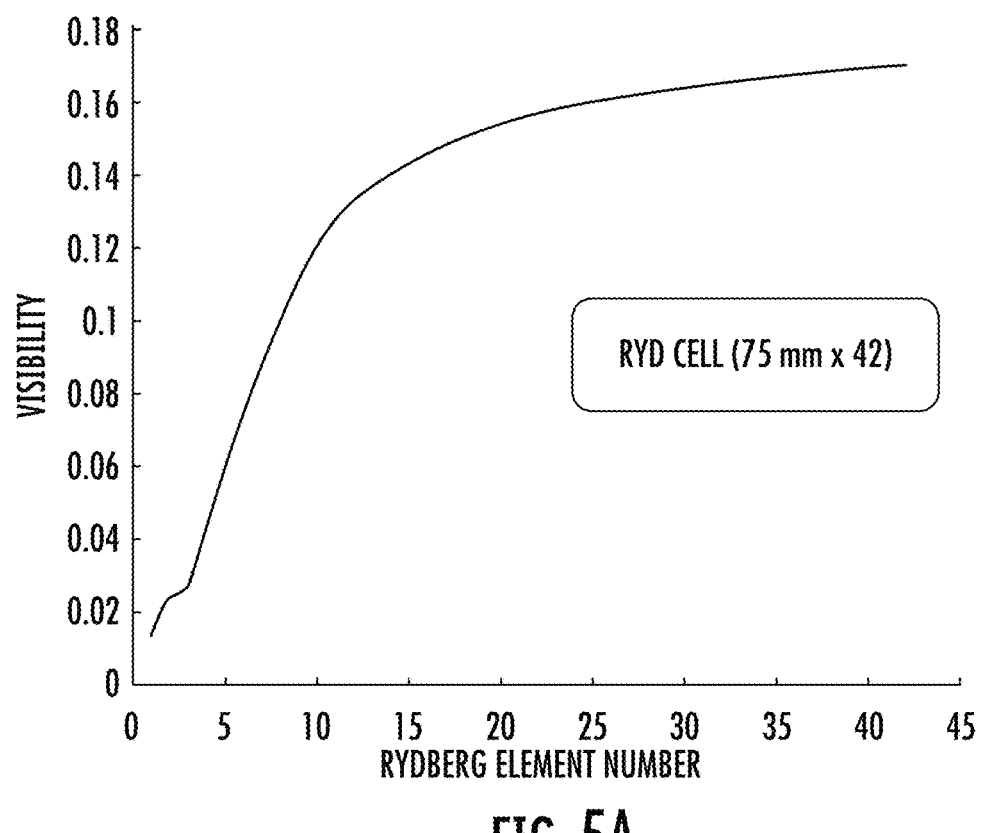
FIG. 5A is a graph of a Rydberg sensor model showing an increase in visibility using a long Rydberg cell without amplification.
FIG. 5B is a graph showing a Rydberg sensor model and the 10 decibel gain for the long Rydberg cell as in FIG. 5A.

The graphs of the Rydberg sensor models for FIGS. 5A and 5B may be compared with the graphs of FIGS. 6A and 6B. In the graphs of FIGS. 5A and 5B, a long Rydberg sensing region 122 without amplification is employed in a Rydberg sensor cell that is 75 millimeters by 42 elements, showing the increase in visibility in the graph of FIG. 5A, and the decibel gain in visibility of about 10 dB gain shown in the graph of FIG. 5B. These graphs may be compared to the daisy chain or series configured Rydberg sensing regions 122 as Rydberg elements with optical amplifiers, such as the Rydberg sensor 120 in FIG. 2 without the RF mirror 135, but with six amplified Rydberg sensing regions 122 as Rudberg elements in series. The graph in FIG. 6A shows the increase in visibility beyond that shown by the single longer Rydberg cell in FIG. 5A, with the 15 dB gain shown in the graphs of FIG. 6B. These graphs illustrate the benefit of using a plurality of Rydberg sensing regions 122 as Rydberg elements and at least one optical amplifier 127 for the probe laser source 134 coupled within the optical path 125 between at least one adjacent pair of Rydberg sensing regions.

Referring now to FIG. 7, there is illustrated generally at 200 a flowchart showing an example method of receiving a radio frequency (RF) signal 124. The method starts (Block 202) and a plurality of Rydberg sensing regions 122 are exposed to an RF signal 124 (Block 204). The method includes operating a probe laser source 134 coupled to an optical path 125 extending from the probe laser source to feed the plurality of Rydberg sensing regions 122 in a series configuration (Block 206). The method further includes operating at least one optical amplifier 127 for the probe laser source 134 coupled within the optical path 125 between at least one adjacent pair of Rydberg sensing regions 122 (Block 208). The process ends (Block 210).

Referring now to FIG. 8, there is illustrated a Rydberg sensor 120' that employs an optical cavity as i.e., an optical quantum radio frequency (QRF) cavity 145' to increase the gain and visibility of the Rydberg sensor. Using the optical QRF cavity 145' design, the probe laser source 134' power and RABI frequency are updated after each pass through a Rydberg sensing region 122' in this example as the illustrated Rydberg element as part of the QRF cavity. The RABI frequency is that frequency at which probability amplitudes of two atomic energy levels fluctuate in an oscillating electromagnetic field. For example, it may be proportional to the transition dipole moment of the two levels and to the amplitude, but not the intensity of the electromagnetic field. As noted before, a plurality of cavities 145' may be used in a series configuration similar to the configuration of the Rydberg sensor 120 of FIG. 2, taking advantage of the use of the delay element such as the RF mirror 135 In the description that follows, only one cavity 145' is described.

As shown in FIG. 8, the Rydberg sensor 120' in this example includes the probe laser source 134' and the optical QRF cavity 145' downstream from the probe laser source and configured to define a path for a plurality of probe laser beams that pass within the QRF cavity. As in the previous example shown in FIG. 2, the probe laser source 134' generates a 780 nanometer probe laser beam, but can vary depending on applications. In this example, the Rydberg sensing region 122' may be a Rydberg element, such as a gas cell, and within the QRF cavity 145' in the path of the plurality of probe laser beam passes. An optical amplifier 127' is within the QRF cavity 145' and in the path of the plurality of probe laser beam passes. The detector 132', in this example a photodetector, is downstream from the QRF cavity 145'. The QRF cavity 145' includes the Rydberg sensing region 122' as a Rydberg element, the optical amplifier 127', such as a titanium sapphire crystal body, first and second mirrors 147', 149', a first reflector as first "high" reflector 153', e.g., a mirror that reflects almost 99.99% of light at a specific wavelength, e.g., 780 nanometers, and a second reflector as an optical coupler 157'.

A coupling laser source 152' is configured to power the optical amplifier 127'. More than one coupling laser source 152' may be used. In this example, the coupling laser source 152' is a 480 nanometer coupling laser, but can vary depending on specific application. The QRF cavity 145' includes this arrangement of optical elements such as the first mirror 147' between the coupling laser source 152' and a first end of the optical amplifier 127' and the second mirror 149' between the probe laser source 134' and the second end of the optical amplifier 127'.

The arrangement of optical elements forming this optical QRF cavity 145' also includes the high reflector 153' as the first reflector adjacent a first end of the Rydberg sensing region 122' as a Rydberg element and aligned with the first mirror 147', and the optical coupler 157' as the second reflector adjacent a second end of the Rydberg sensing region 120' as a Rydberg element and aligned with the second mirror 149'. An optical splitter 161' is downstream from the coupling laser source 152', and a dichroic mirror 154' is upstream of the detector 132'. A controller 160' is coupled to the probe laser source 134' and the detector 132', and in this example, also to the coupling laser source 152' and Rydberg sensing region 122'. An optical lens 163' is between the splitter 161' and first mirror 147' to focus the coupling laser beam into the optical amplifier 127'.

In operation, the coupling laser source 152' provides gain to the optical amplifier 127', which is seeded by the 780 nanometer probe laser source 134' so that amplification at the optical amplifier occurs at about 780 nanometers within the QRF cavity 145'. The probe laser source 134' emits its 780 nanometer laser beam that is reflected by the first mirror 147' into the first reflector as the high reflector 153', which reflects the probe laser beam into the Rydberg sensing region 122' as a Rydberg element and through the optical coupler as the second reflector 157', through the dichroic mirror 159' into the detector 132'. At the same time, the probe laser beam from the probe laser source 134' is reflected off the second reflector 157' as the optical coupler back to the second mirror 149' and back through the optical amplifier 127' where it is then reflected again after amplification into the first or high reflector 153' and then to the Rydberg sensing region 122', thus forming another of the probe laser beam passes within the QRF cavity 145'. The 480 nanometer coupling laser beam from the coupling laser source 152' is split at the optical splitter 161' to pump the optical gain medium so that it provides gain to the 780 nm laser as it passes from the optical splitter. The beam is also split so that a portion of the coupling laser beam passes into the dichroic mirror 154' and feeds the Rydberg sensing region 122' as the Rydberg element. The laser path from the probe laser source 134' is labeled "S" and the path from the coupling laser source 152' is labeled "C."

In this experimental setup for the Rydberg sensor 120', beam blocks 167' absorb the coupling laser beam for safety. The controller 160' controls operation of the probe laser source 134' and coupling laser source 152', not only to seed the wavelength of the probe laser beam to which the gain is applied, but also to determine whether the optical QRF cavity 145' is operated below a laser threshold, at a laser threshold, or above a laser threshold. It is possible to modify the 480 nanometer and 780 nanometer center laser frequencies to optimize either gain of the optical QRF cavity 145' or optimize performance at the Rydberg sensing region 122' as a Rydberg element in this example.

It is also possible to add an intensity modulator 136' as shown in FIG. 8 that may have its repetition rate and duty cycle changed to help fill the QRF cavity 145' with additional energy, or reduce the energy level and make the QRF cavity more energy sparse. A modelocker element (not shown) may be optionally inserted within the QRF cavity 145', e.g., an acousto-optic modulator (AOM), or the QRF cavity design may support hard or soft KERR lens mode locking, or support a saturable absorber based modelocker, such as known to those skilled in art, and operate the QRF cavity 145' on the edge of pulsed or continuous wave states. The controller 160' may control any acousto-optic modulation repetition rate and match it to the QRF cavity 145' round trip time.

The optical QRF cavity 145' may also be operated such that small linear changes in the incoming radio frequency (RF) power from the signal of interest as the RF signal 124' may lead to large, non-linear changes in the optical state such as at the edge of any laser stability, for example, pulsed versus continuous wave (CW) states. The length of the QRF cavity 145' may also be controlled using piezoelectric mirrors, such as the first and second mirrors 147', 149', and shift the resonant frequencies of the QRF cavity 145' and align it with the transition resonances of the Rydberg sensor 120'.

It is also possible to insert an optical pulse picker into the optical QRF cavity 145' to dump optical radiation at desired times and quickly "reset" the Rydberg sensor 120' to make a new RF measurement of the RF signal 124' that enters into and is measured at the Rydberg sensing region 122'. The optical pulse picker may be formed as an electrically controlled optical switch that extracts single pulses from a fast pulse train. Other designs known to those skilled in the art may be used. The QRF cavity 145' design may be either stable or unstable, depending on the desired outputs. An unstable QRF cavity 145' may allow for more continuous sampling of RF radiation from the RF signal 124', but may not provide as much visibility enhancement as a stable QRF cavity, which may sparsely sample incoming RF radiation due to the need for the QRF cavity to reset after a certain number of round trips.

Figure 9A:
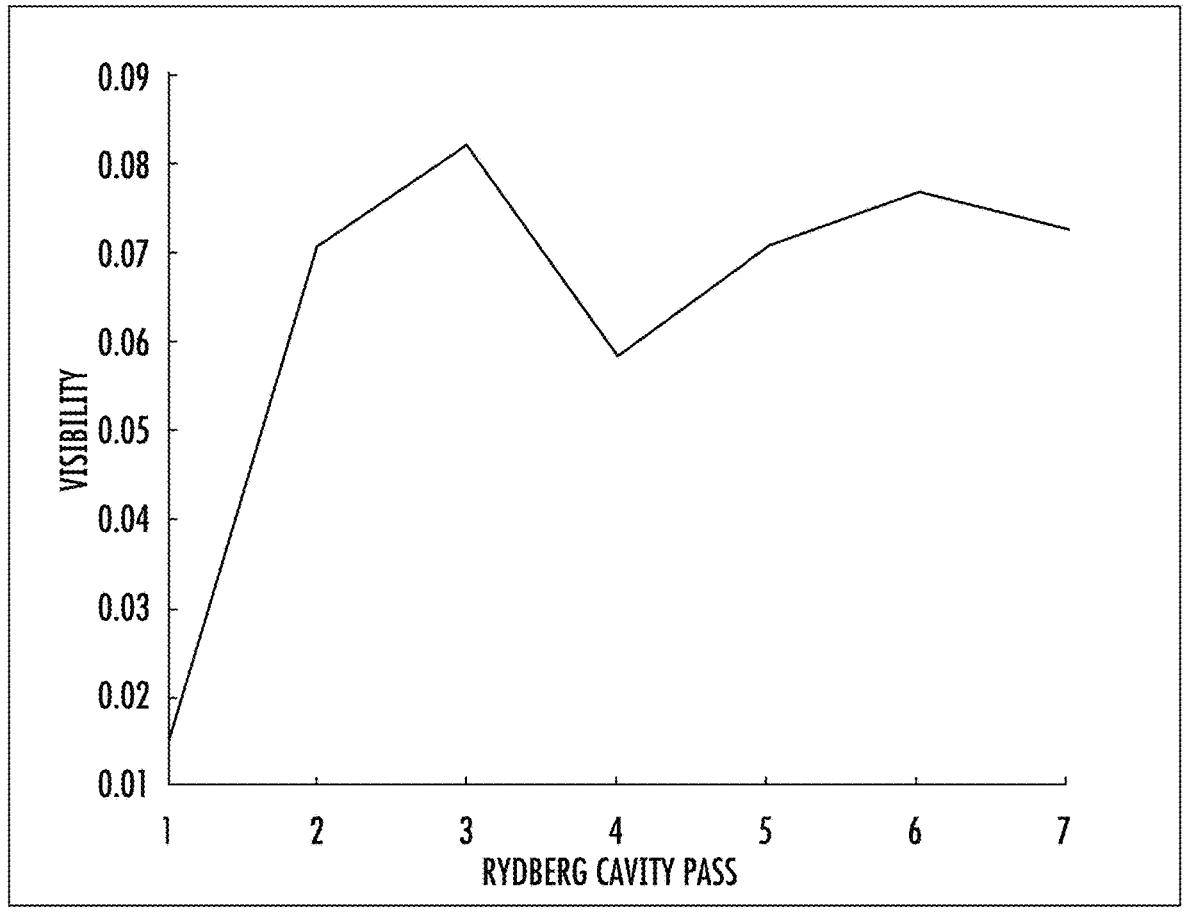
FIG. 9A is a graph of a Rydberg sensor model employing a QRF cavity without amplification and showing increased visibility.
Figure 9B:
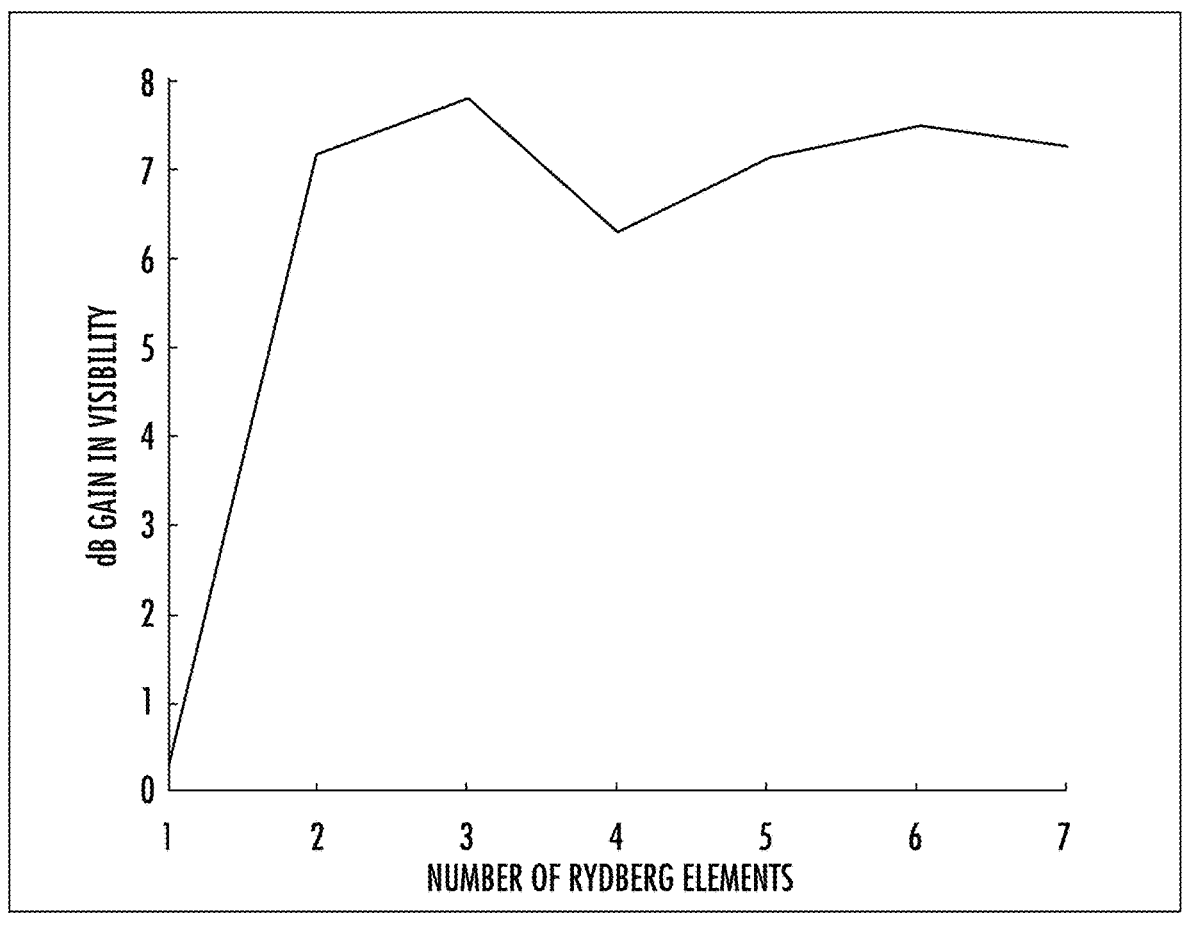
FIG. 9B is a graph of the Rydberg sensor model as in FIG. 9A showing the decibel gain in visibility.

Referring now to FIGS. 9A and 9B, the experimental results for a modeled optical QRF cavity of a Rydberg sensor with limited amplification shows the increase in visibility of the Rydberg sensor, where FIG. 9A shows the increase in visibility with a changing number in Rydberg cavity passes and the decibel gain increase shown in FIG. 9B. These graphs show the benefit of a cavity design.

Figure 10:
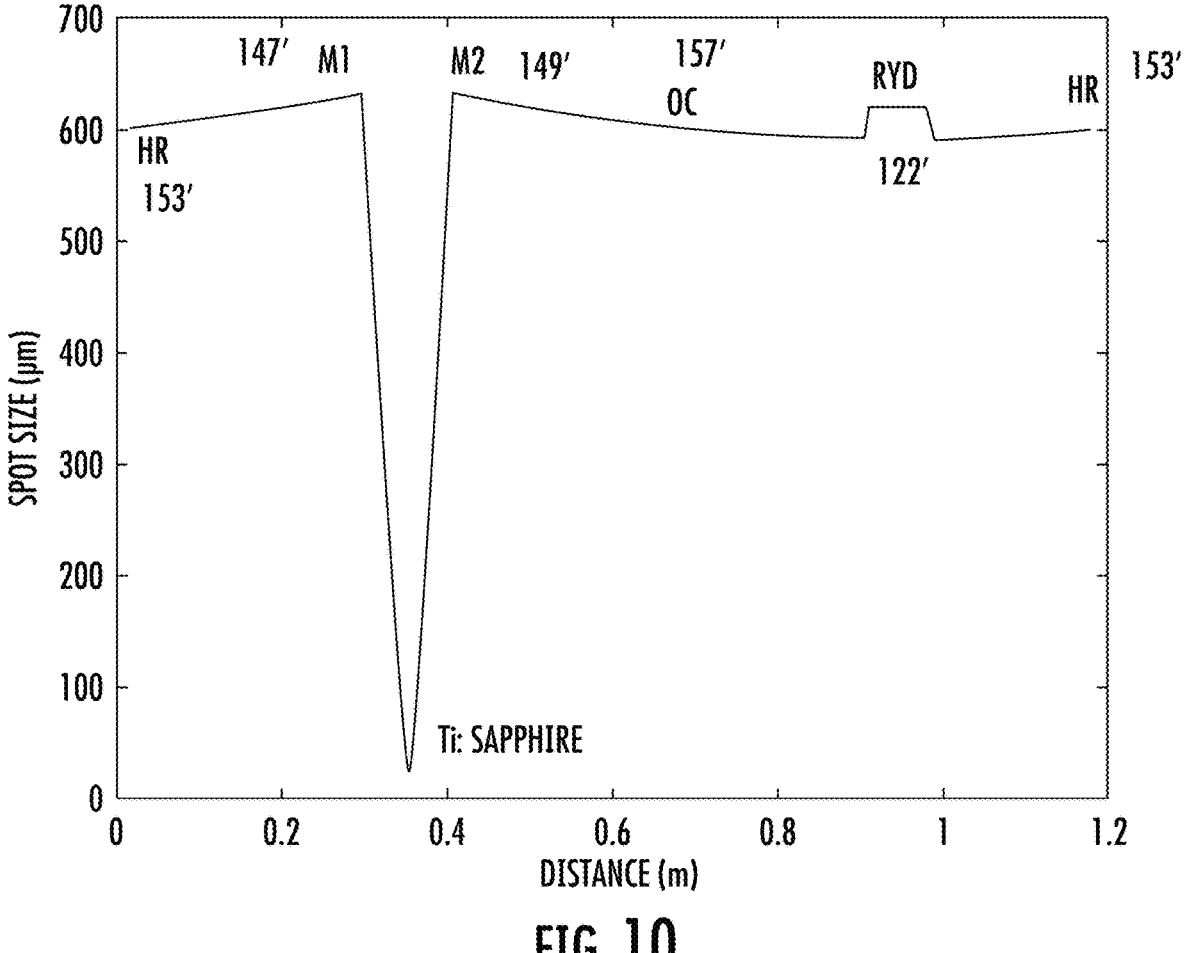
FIG. 10 is a graph showing the distance between components in the QRF cavity of the Rydberg sensor of FIG. 8.

The graph in FIG. 10 shows the distance in meters for various components in an experimental test platform of the optical QRF cavity 145' and shows the spot size from the first and second mirrors 147', 149' to the optical amplifier 127' as the titanium sapphire crystal body.

Figure 11:
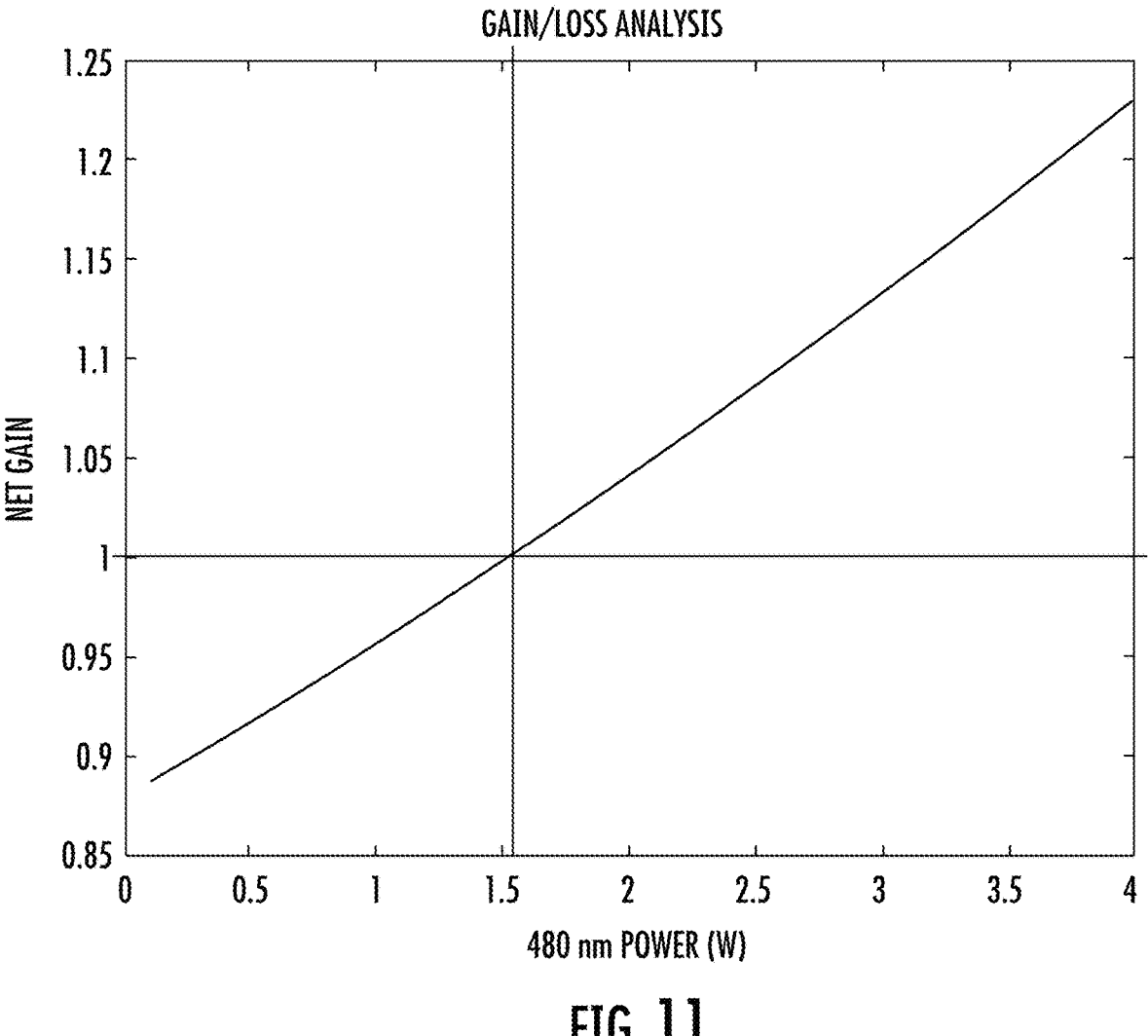
FIG. 11 is a graph showing the gain/loss analysis for the QRF cavity of FIG. 8.

An experimental gain/loss analysis is shown in the graph of FIG. 11 with the gain shown on the vertical axis and the coupling laser power as the 480 nanometer power in watts, indicative that 1.7 watts for the 480 nanometer QRF cavity 145' design is required, with 1.6 watts for the loss equalization, and 0.1 watts to drive the Rydberg sensing region 122' as a Rydberg element when the coupling laser beam is split at the splitter 161'.

Figure 12:
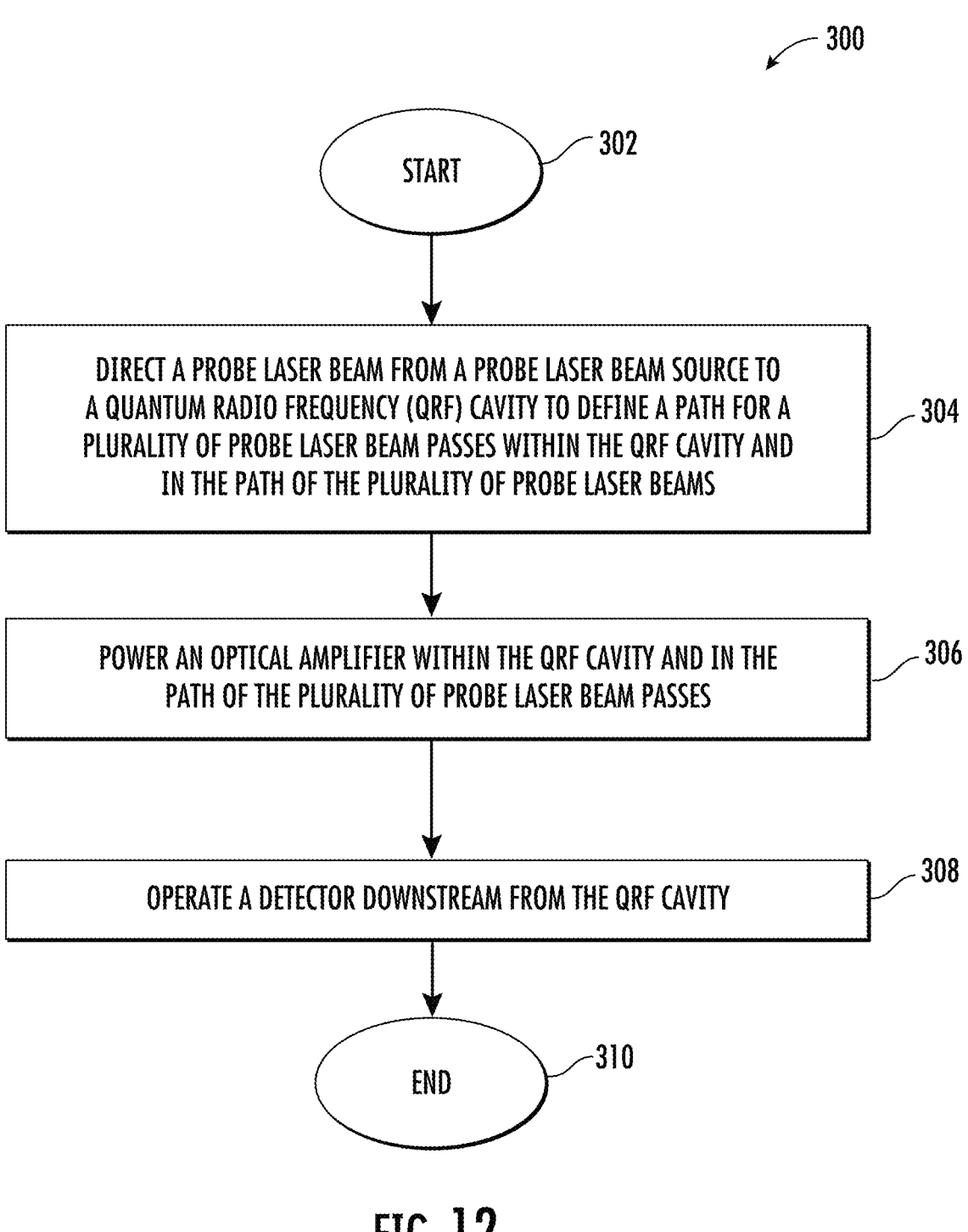
FIG. 12 is a flowchart showing a method for Rydberg sensing employing the Rydberg sensor of FIG. 8.

Referring now to FIG. 12, there is illustrated generally at 300 a flowchart showing an example for Rydberg sensing. The process starts (Block 302) and continues by directing a probe laser beam from a probe laser beam source 134' to a quantum radio frequency (QRF) cavity 145' as an optical cavity to define a path for a plurality of probe laser beam passes within the QRF cavity, with the Rydberg sensing region 122' within the QRF cavity and in the path of the plurality of probe laser beam passes (Block 304). The method includes powering an optical amplifier 127' within the QRF cavity 145' and in the path of the plurality of probe laser beam passes (Block 306). A detector 132' is operated downstream from the QRF cavity (Block 308). The process ends (Block 310).

This application is related to copending patent applications entitled, "RYDBERG SENSOR HAVING QUANTUM RADIO FREQUENCY (QRF) CAVITY WITH OPTICAL AMPLIFIER AND ASSOCIATED METHODS, which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A Rydberg sensor comprising:
   a plurality of Rydberg sensing regions;
   a probe laser source;
   an optical path extending from the probe laser source to feed the plurality of Rydberg sensing regions in a series configuration; and
   at least one optical amplifier for the probe laser source coupled within the optical path between at least one adjacent pair of Rydberg sensing regions.

2. The Rydberg sensor of claim 1 wherein the at least one optical amplifier comprises a respective optical amplifier coupled between each adjacent pair of a plurality of pairs of Rydberg sensing regions.

3. The Rydberg sensor of claim 1 comprising at least one time delay element coupled between the at least one optical amplifier and an input signal of interest (SOI).

4. The Rydberg sensor of claim 3 wherein the at least one time delay element comprises a Radio Frequency (RF) mirror.

5. The Rydberg sensor of claim 1 comprising a coupling laser source coupled to the optical path.

6. The Rydberg sensor of claim 5 comprising a detector downstream from the plurality of Rydberg sensing regions.

7. The Rydberg sensor of claim 6 comprising a controller coupled to the probe laser source, the coupling laser source, and the detector.

8. The Rydberg sensor of claim 1 wherein the plurality of Rydberg sensing regions comprises a plurality of Rydberg gas cells.

9. A Rydberg sensor comprising:

a plurality of Rydberg sensing regions;

a probe laser source;

an optical path extending from the probe laser source to feed the plurality of Rydberg sensing regions in a series configuration; and a plurality of optical amplifiers for the probe laser source coupled within the optical path between a plurality of adjacent pairs of Rydberg sensing regions.

10. The Rydberg sensor of claim 9 comprising a plurality of time delay elements, each time delay element coupled between a respective optical amplifier and an input signal of interest (SOI).

11. The Rydberg sensor of claim 10 wherein the plurality of time delay elements comprises a respective delay path in an RF mirror.

12. The Rydberg sensor of claim 9 comprising a coupling laser source coupled to the optical path.

13. The Rydberg sensor of claim 12 wherein the plurality of Rydberg sensing regions comprises a plurality of Rydberg gas cells.

14. The Rydberg sensor of claim 9 comprising a detector downstream from the plurality of Rydberg sensing regions.

15. A method for receiving a Radio Frequency (RF) signal comprising:

exposing a plurality of Rydberg sensing regions to the RF signal;

operating a probe laser source coupled to an optical path extending from the probe laser source to feed the plurality of Rydberg sensing regions in a series configuration; and operating at least one optical amplifier for the probe laser source coupled within the optical path between at least one adjacent pair of Rydberg sensing regions.

16. The method of claim 15 wherein the at least one optical amplifier comprises a respective optical amplifier coupled between each adjacent pair of a plurality of pairs of Rydberg sensing regions.

17. The method of claim 16 comprising inserting at least one time delay element between the at least one optical amplifier and an input signal of interest (SOI).

18. The method of claim 17 wherein the at least one time delay element is provided by an RF mirror.

19. The method of claim 15 comprising operating a coupling laser source coupled to the optical path.

20. The method of claim 15 comprising operating a detector downstream from the plurality of Rydberg sensing regions.

* * * * *